United States Patent [19]

Minami et al.

[11] Patent Number: 5,072,286
[45] Date of Patent: Dec. 10, 1991

[54] SEMICONDUCTOR MEMORY DEVICE HAVING MEMORY CELLS INCLUDING IG FETS IN A SYMMETRICAL ARRANGEMENT

[75] Inventors: Masataka Minami, Hitachi; Shoji Shukuri, Koganei; Mitsuru Hirao, Ibaraki; Toshiaki Yamanaka, Iruma, all of Japan

[73] Assignee: Hitachi, Ltd., Tokyo, Japan

[21] Appl. No.: 587,974

[22] Filed: Sep. 25, 1990

[30] Foreign Application Priority Data

Sep. 28, 1989 [JP] Japan .................................. 1-250477

[51] Int. Cl.⁵ .................... H01L 27/10; H01L 29/04; H01L 27/02; G11C 11/00
[52] U.S. Cl. ........................................ 357/45; 357/59; 357/42; 365/156
[58] Field of Search .................... 357/42, 45, 59 G; 365/156

[56] References Cited

U.S. PATENT DOCUMENTS

| | | | |
|---|---|---|---|
| 4,481,524 | 11/1984 | Tsujide | 357/51 |
| 4,535,426 | 8/1985 | Ariizumi et al. | 357/51 |
| 4,604,639 | 8/1986 | Kinoshita | 357/59 G |
| 4,724,530 | 2/1988 | Dingwall | 365/156 |

OTHER PUBLICATIONS

Okazaki et al., "A 30 ns 256 K Full CMOS SRAM", 1986, IEEE Int. Solid State Circuits Conference, pp. 204–205, 349.

*Primary Examiner*—Rolf Hille
*Assistant Examiner*—Robert P. Limanek
*Attorney, Agent, or Firm*—Antonelli, Terry, Stout & Kraus

[57] ABSTRACT

A semiconductor memory device has memory cells each including first and second inverters cross-coupled to each other through first and second interconnecting conductors for forming a bistable circuit and first and second transfer gates connected between the first inverter and address signal conductors and between the second inverter and the address signal conductors, respectively. The first and second interconnecting conductors are arranged substantially point-symmetrically and have at least portions substantially parallel with each other on a surface of a substrate, and IG FETs constituting the first and second inverters have their gate electrodes arranged substantially parallel with one another and extending in a direction substantially perpendicular to the parallel portions of the first and second interconnecting conductors for the cross-coupling on the surface of the substrate.

13 Claims, 8 Drawing Sheets

SEMICONDUCTOR MEMORY DEVICE HAVING MEMORY CELLS INCLUDING IG FETS IN A SYMMETRICAL ARRANGEMENT

BACKGROUND OF THE INVENTION

The present invention relates to a semiconductor memory device, and in particular to a full CMOS static RAM device.

The static RAM devices (hereinafter abbreviated as SRAM) using MOS transistors are classified into (1) full CMOS SRAM devices having both memory cells and peripheral circuits constituted by n-MOS transistors and p-MOS transistors; and (2) SRAM devices having memory cells constituted by n-MOS transistors and high resistive loads, and peripheral circuits constituted by CMOS transistors.

Figure 1:
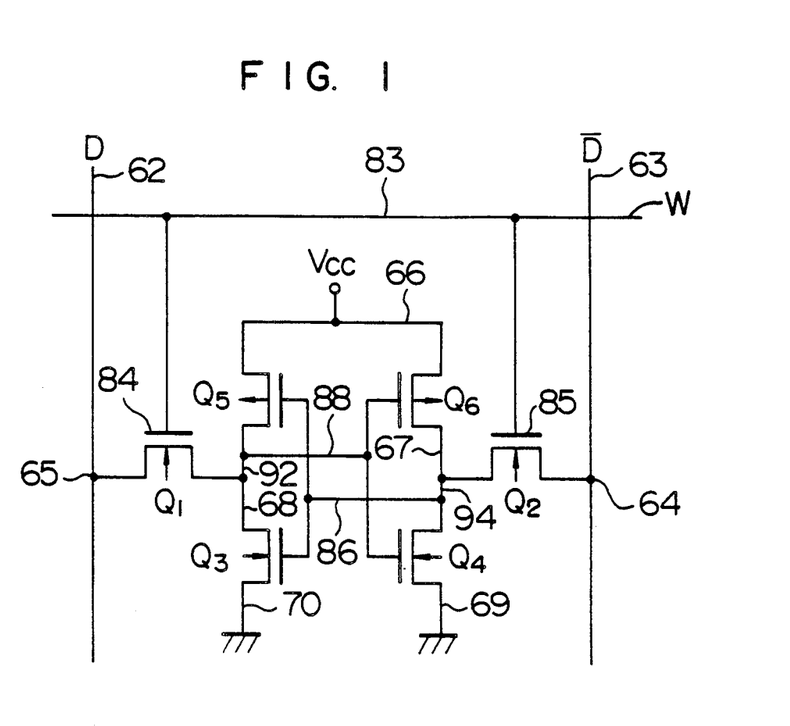
FIGS. 1 and 2 are circuit diagrams showing an essential part of a static RAM (SRAM) device.
Figure 2:
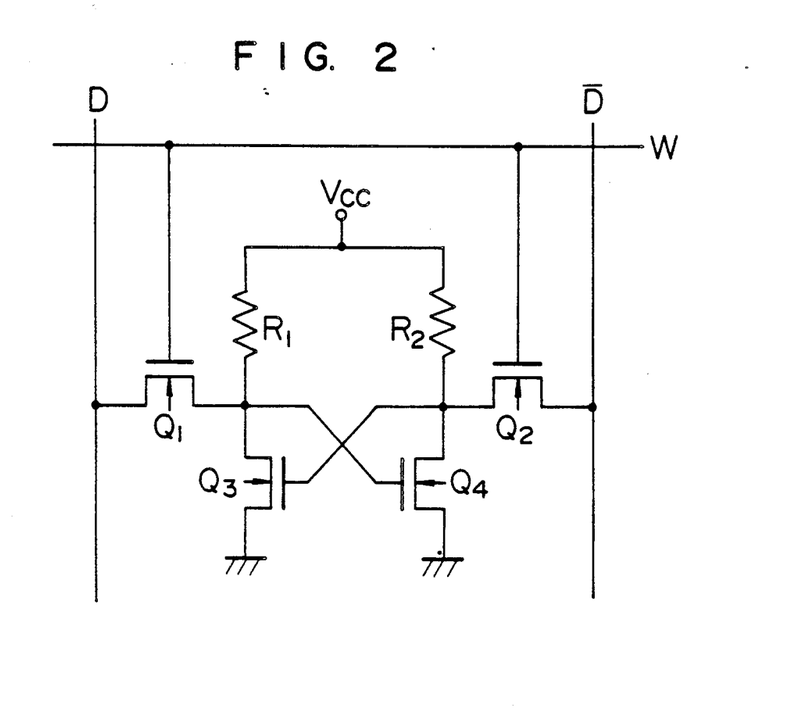

FIG. 1 is an equivalent circuit diagram of a memory cell in a full CMOS SRAM and FIG. 2 is an equivalent circuit diagram of a memory cell in a SRAM having its cells constituted by n-MOS transistors.

In FIG. 1, a cell of the full CMOS SRAM comprises a first inverter including a load MOS transistor (p-MOS) Q5 and a driver MOS transistor (n-MOS) Q3; a second inverter including a load MOS transistor (p-MOS) Q6 and a driver MOS transistor (n-MOS) Q4; and transfer MOS transistors (n-MOS's) Q1 and Q2, as is well known.

Figure 3:
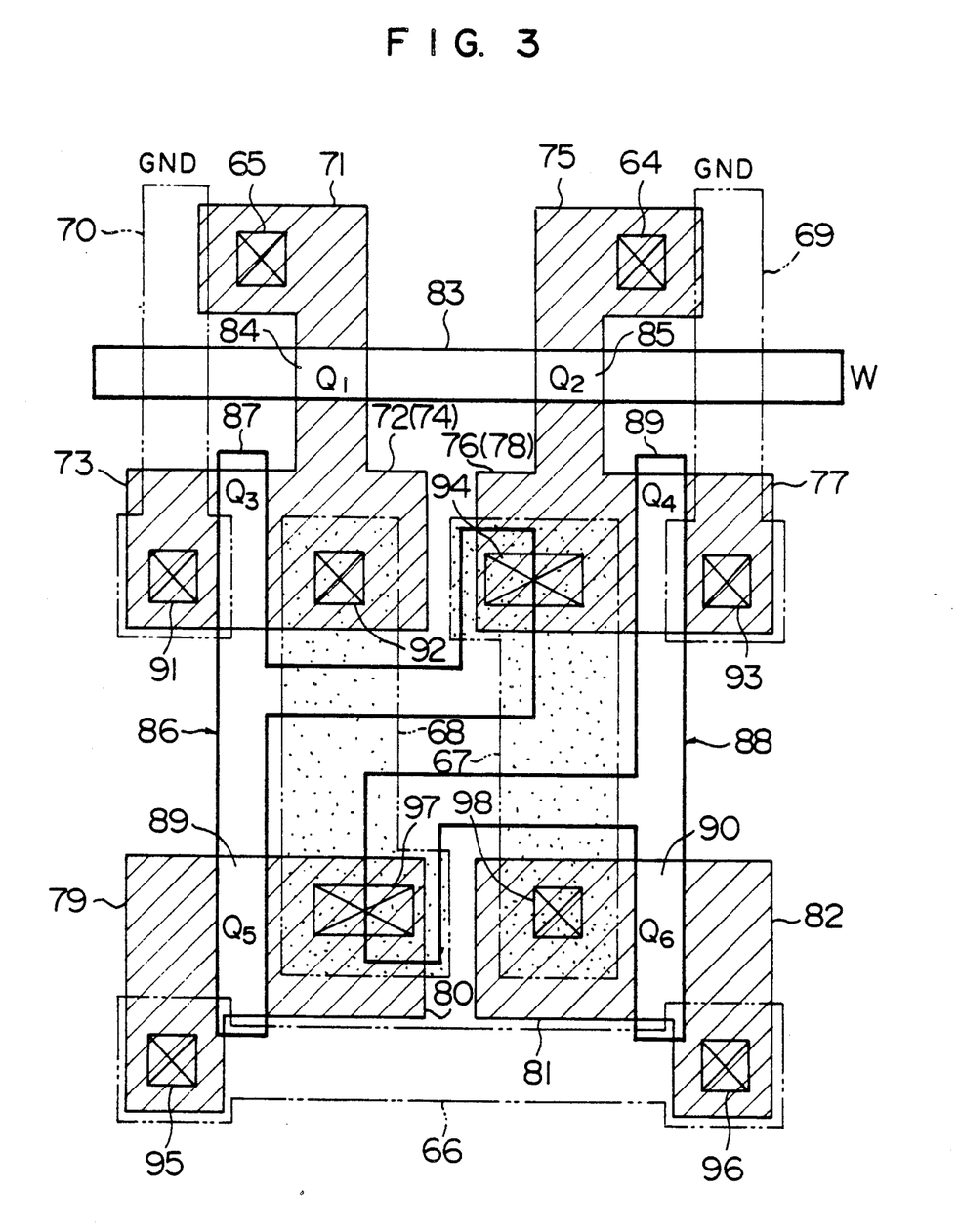
FIG. 3 is a plan view showing a geometrical layout of a prior art full CMOS SRAM device.

Reference numerals used in FIG. 1 correspond to those in FIG. 3. The structure (geometrical layout) of the SRAM shown in FIG. 1 will be described with reference to FIGS. 1 and 3.

As shown in FIG. 2, a cell of the SRAM having its cells constituted by n-MOS transistors is different from that of the full CMOS SRAM in that the load MOS transistors Q5 and Q6 of the latter CMOS SRAM are replaced with high value resistors R1 and R2, respectively.

SRAM's having a structure shown in FIG. 2 have heretofore been predominantly used since it is possible to provide a device having a small cell area and a high integration degree.

Recently, industry has been increasingly interested in memory cells in the full CMOS SRAM in a deep submicron age due to the fact that the reliability of the full CMOS SRAM is high, that a current consumed at standby time is low, that the operable range of temperatures is wide and that the device can work even at a low voltage of a power supply.

Various structures of the full CMOS SRAM have been proposed. A full CMOS SRAM having a layout shown in FIG. 3 is proposed in, for example, 1986 IEEE International Solid-State Circuits Conference Digest of Technical Papers, pp. 204–205.

In FIG. 3, the transfer MOS transistor (hereinafter abbreviated as TR-MOS) comprises source/drain regions 71 and 72 and a gate electrode 84 constituting a word line 83 depicted with thick solid lines. The TR-MOS Q2 comprises source/drain regions 75 and 76 and a gate electrode 85 constituting a word line 83.

The driver MOS transistor (hereinafter abbreviated as DV-MOS) Q3 comprises source/drain regions 73 and 74 and a gate electrode 87 constituting an interconnecting conductor 86 (depicted with thick solid lines). The DV-MOS Q4 comprises source/drain regions 76 and 77 and a gate electrode 89 constituting an interconnecting conductor 88 (depicted with thick solid lines).

The load MOS transistor (hereinafter abbreviated as FK-MOS) Q5 comprises source/drain regions 79 and 80 and a gate electrode 89 constituting an interconnecting conductor 86. The FK-MOS Q6 comprises source/drain regions 81 and 82 and a gate electrode 90 constituting an interconnecting conductor 88.

The source/drain region 72 (74) of the TR-MOS Q1 (DV-MOS Q3) is connected with the source/drain region 80 of the FK-MOS Q5 via an interconnecting conductor 68. The source/drain region 72 (74) and 80 are connected with the interconnecting conductor 68 via contact holes 92 and 97, respectively.

Similarly, the source/drain region 76 (78) of the TR-MOS Q2 (DV-MOS Q4) is connected with the source/drain region 81 of the FK-MOS Q6 via an interconnecting conductor 67. The source/drain regions 76 (78) and 81 are connected with the interconnecting conductor 67 via contact holes 94 and 98, respectively.

The source/drain regions 79 and 82 are connected with a power supply line 66 via contact holes 95 and 96.

The source/drain region 73 of the DV-MOS Q3 is connected with a ground line 70 via a contact hole 91. The source/drain region 77 of the DV-MOS Q4 is connected with a ground line 69 via a contact hole 93.

The source/drain region 71 of the TR-MOS Q1 is connected with a data line 62 (FIG. 1) via a contact hole 65. The source/drain region 75 is connected with a data line 63 via a contact hole 64.

In the thus formed six MOS cell as is well known, a parasitic capacity of the source/drain region 72 of the DV-MOS Q3 and a parasitic capacity on the interconnecting conductor 68 connected with the source/drain region 72 and gate electrodes, etc. function as one storing node while a parasitic capacity of the source/drain region 76 of the DV-MOS Q4 and a capacity on the interconnecting conductor 67 connected with the source/drain region 76 and the gate electrodes, etc. function as the other storing node.

SUMMARY OF THE INVENTION

As a result of the inventors' investigation, the following has been made clear.

It is preferable in a CMOS RAM that capacitances of storing nodes in each cell be substantially equal in order to prevent stored contents from being changed due to external noises such as caused by α-rays.

More specifically, referring to FIG. 3, it is preferable that a parasitic capacity of the source/drain region 72 (74) of the TR-MOS Q1 (DV-MOS Q3) be substantially equal to that of the source/drain region 76 of the TR-MOS Q2 (DV-MOS Q4) and that a parasitic capacity of the source/drain region 80 of the FK-MOS Q5 be substantially equal to that of the source/drain region 81 of the FK-MOS Q6.

It has been found from the comparison of the source/drain region 72 (74) of the MOS Q1 (Q3) with the source/drain region 76 (78) of the MOS Q2 (Q4) that the parasitic capacity of the source/drain region 76 (78) of the MOS Q2 (Q4) are less than that of the source/drain region 72 (74) of the MOS Q1 (Q3) since a diffusion layer cannot be formed under the connecting conductor 86. Similarly, a parasitic capacity of the source/drain region 80 of the FK-MOS Q5 is less than that of the source/drain region 81 of the FK-MOS Q6.

Consequently, storage content in a cell may be undesirably readily changed to "0" or "1" from the other logical state such as "1" or "0", due to noise such as caused by α-rays.

In addition, since n- and p-MOS transistors are formed in each cell in a full CMOS SRAM, isolation regions are necessary to isolate the source/drain regions of p-MOS transistor from those of n-MOS transistors, which will be a great obstacle to a high integration degree.

It is an object of the present invention to provide a semiconductor memory device having a high integration degree in which stored information is hardly changed due to noises.

According to one aspect of the present invention, there is provided a semiconductor memory device including a plurality of semiconductor memory cells formed in a surface of a semiconductor substrate and arranged in rows and columns, each of the memory cells being connected with first and second address signal conductors for writing/reading information in the memory cell, each memory cell comprising: first and second insulated gate field effect transistor (IG FET) inverters cross-coupled to each other through first and second interconnecting conductors to constitute a bistable circuit; a first IG FET transfer gate connected between the address signal conductors and the first inverter, the first IG FET transfer gate being connected with the first inverter through the second interconnecting conductor; and a second IG FET transfer gate connected between said address signal conductors and the second inverter, the second IG FET transfer gate being connected with the second inverter through the first interconnecting conductor, in which the first and second interconnecting conductors are arranged substantially point-symmetrically and have at least portions substantially parallel with each other on the surface of the substrate, and IG FETs constituting the first and second inverters have their gate electrodes arranged substantially parallel with one another and extending in a direction substantially perpendicular to the parallel portions of the first and second interconnecting conductors for the cross-coupling on the surface of the substrate, and IG FETs constituting the first and second transfer gates have their gate electrodes arranged substantially parallel with those of the IG FETs constituting the first and second inverters and forming part of one of the address signal conductors on the surface of the substrate.

According to another aspect of the present invention, a semiconductor memory device may have structural features as follows:

(1) In a semiconductor memory device including a plurality of memory cells formed in a surface of a semiconductor substrate, each of the memory cell comprising two load IG FETs, two driver IG FETs and two transfer IG FETs, the first load IG FET has its source/-drain regions and gate electrode arranged substantially symmetrically with those of the second load IG FET, the first driver IG FET has its source/drain regions and gate electrode arranged substantially symmetrically with those of the second driver IG FET, and the first transfer IG FET has its source/drain regions and gate electrode arranged substantially symmetrical; with those of the second transfer IG FET.

(2) All gate electrodes of the six IG FETs are arranged substantially parallel.

(3) Lead electrodes for the source/drain regions of the IG FETs may be formed by self alignment using field insulating layers as a mask.

According to the above-mentioned features, parasitic capacitances formed in each cell are symmetrical with each other and the parasitic capacitance values are almost equal, which contributes to stabilization of contents or state of memory cells. If all the gate electrodes are arranged substantially parallel and the source/drain lead electrodes of IG FETs are formed by self alignment, the length of the source/drain regions in a direction perpendicular to the gate electrodes can be made smaller, resulting in an enhancement of integration density.

DESCRIPTION OF THE PREFERRED EMBODIMENTS

The present invention will now be described with reference to the accompanying drawings. In embodiments which will be described, it is assumed that source/drain lead electrodes of insulated gate field effect type transistor (IG FET) be formed by self-alignment using field insulating layers as a mask and that the IG FETs constituting a memory cell are exemplarily MOS FETs.

Since the length of the source/drain region in a direction perpendicular to the gate electrode may be made smaller in accordance with the thus formed self-aligned MOS FET, a high integration degree could be provided if the MOS FETs are generally formed in a direction perpendicular to the gate electrodes, that is, MOS FETs are formed in such a manner that the gate electrodes are substantially in a parallel relationship with each other.

When an n-MOS FET and a p-MOS FET are formed close to each other with the prior art, spacings necessary for isolating the n-MOS FET from the p-MOS FET could not be assured if lead electrodes are formed in accordance with a minimum layout rule in the prior art. Therefore, it was impossible, according to the prior art, to form the lead electrodes in accordance with a minimum layout rule.

Since the length or the width of the source/drain region measured in a direction perpendicular to the gate electrodes can be made narrower by the use of the above mentioned self-alignment MOS technique, the spacing necessary for isolation can be assured between source/drain regions with the lead electrodes formed in accordance with the minimum layout rule. Hence, isolation with a small area will now be possible without provision of any means for isolation.

Figure 4:
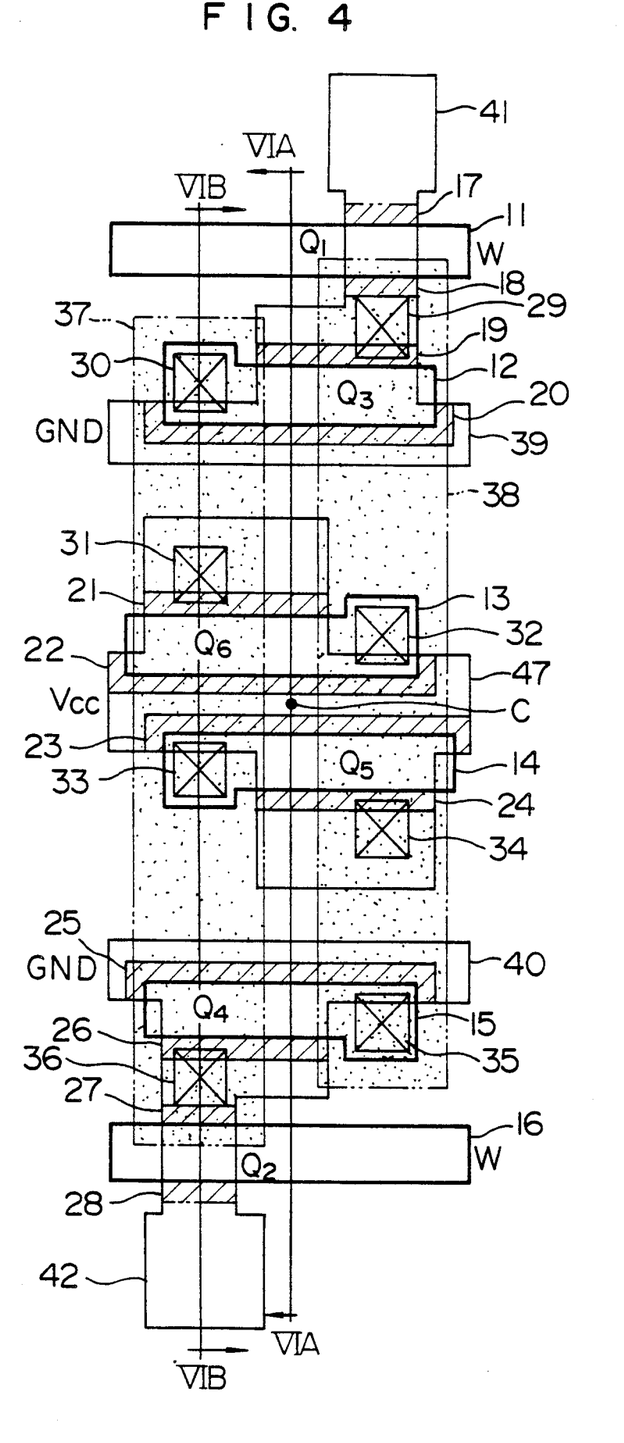
FIG. 4 is a plan view showing a full CMOS SRAM device according to one embodiment of the present invention.
Figure 5:
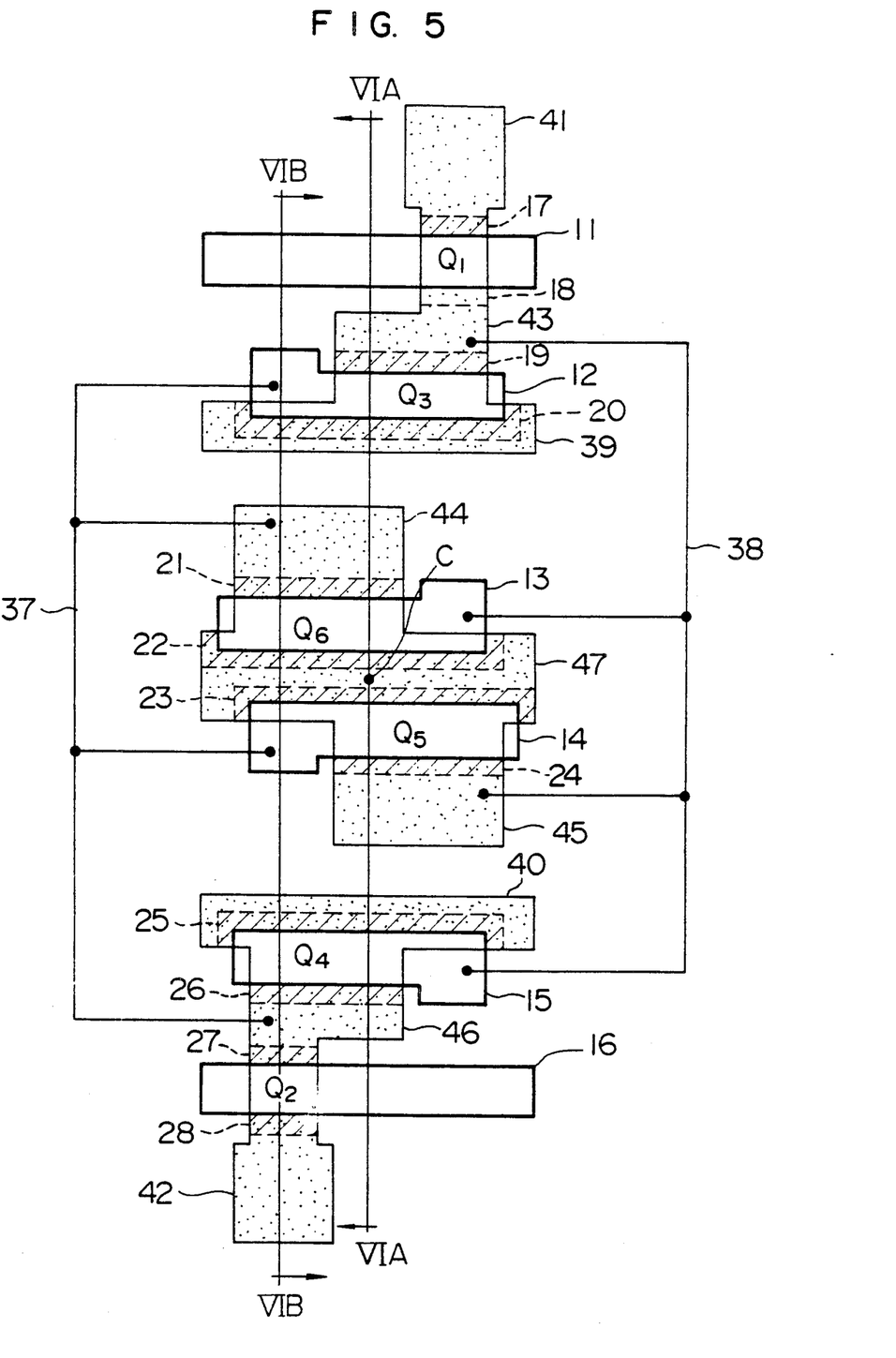
FIG. 5 is a schematic plan view showing only an essential part of FIG. 4.
Figure 6A:
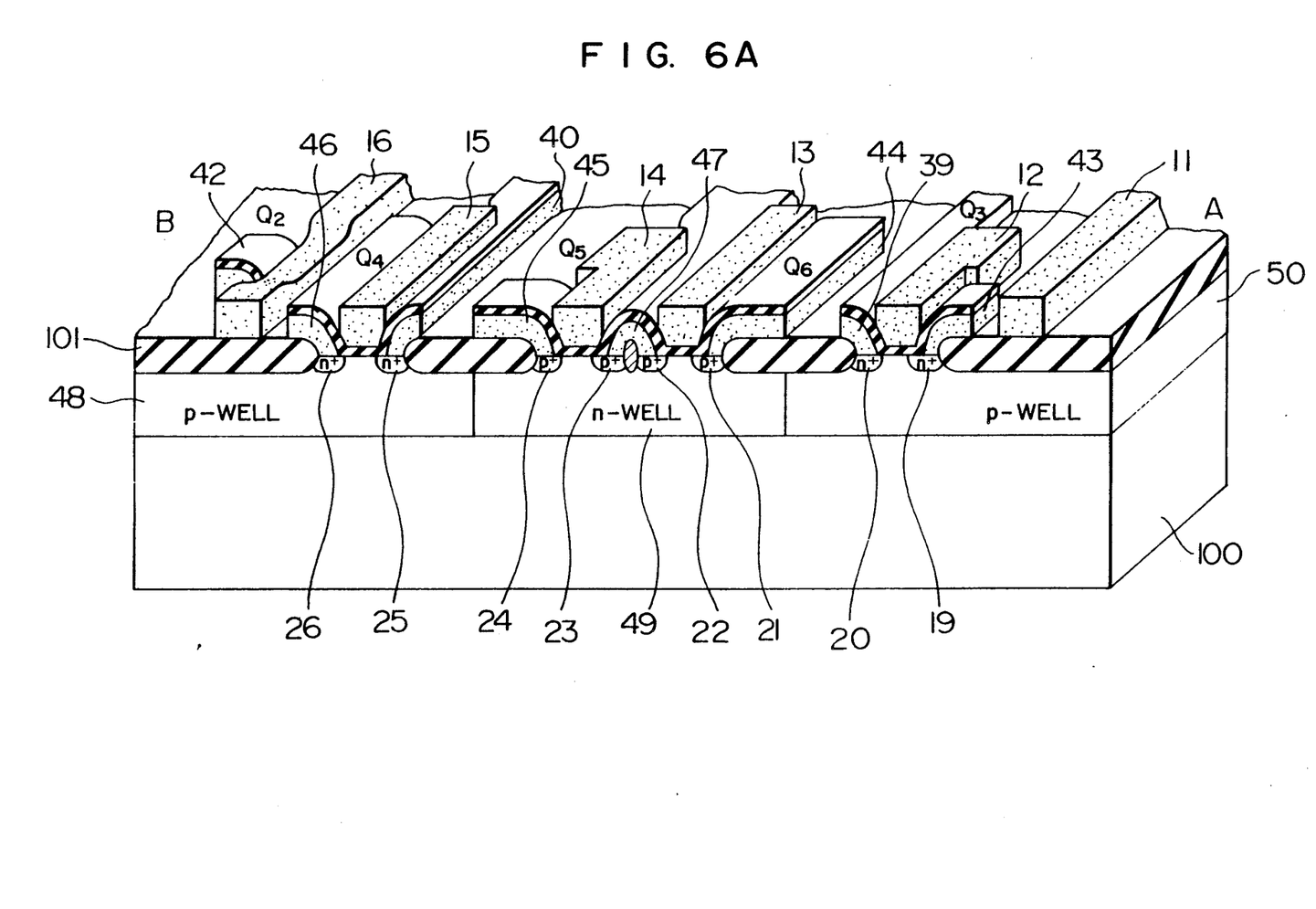
FIG. 6A is a perspective, sectional view taken along line VIA—VIA in FIG. 4.
Figure 6B:
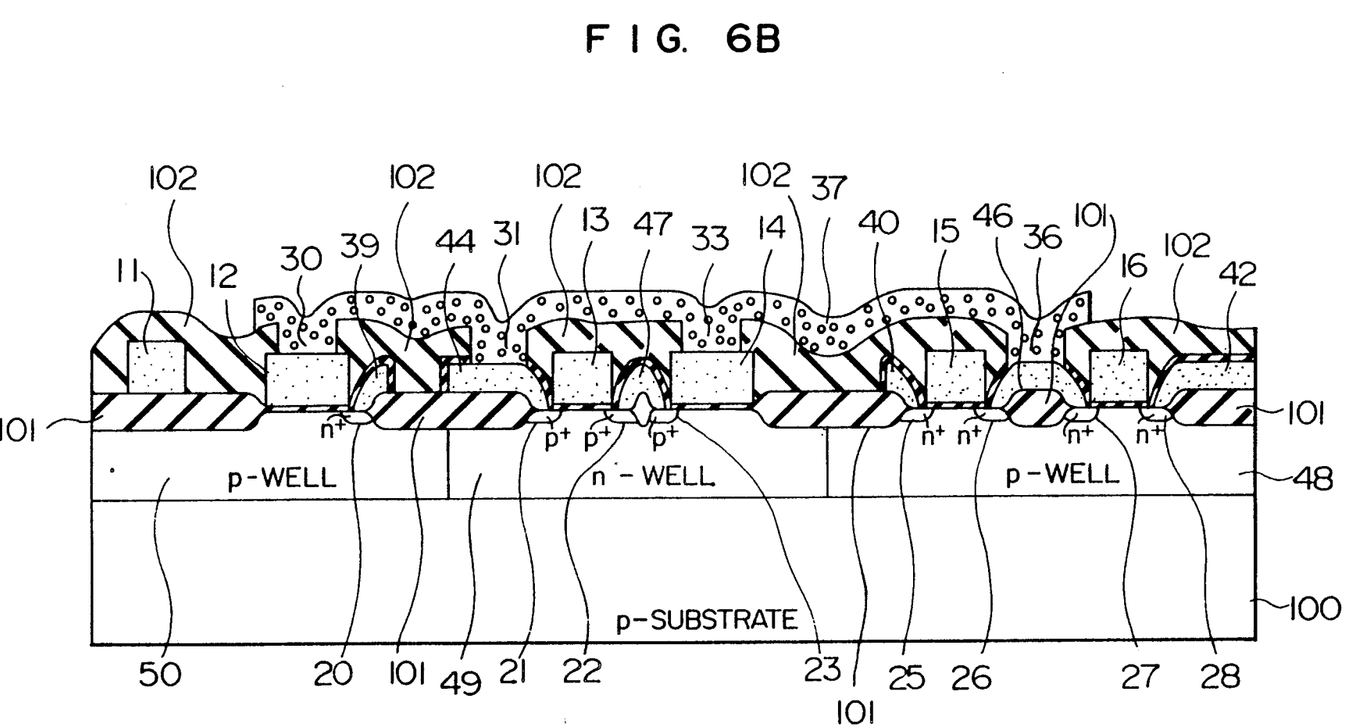
FIG. 6B is a sectional view taken along line VIB—VIB in FIG. 4.

FIG. 4 is a plan view showing a layout of a memory cell of a full CMOS SRAM device, FIG. 5 is a schematic plan view showing only an essential part of FIG. 4, FIG. 6A is a perspective, sectional view taken along line VIA—VIA in FIG. 4, and FIG. 6B is a sectional view taken along line VIB—VIB in FIG. 4. Like components are designated with same reference numerals. The SRAM device generally comprises a plurality of cells formed in a surface of a semiconductor substrate and arranged in rows and columns, one of the cells being showing in FIG. 4.

In FIG. 4, a TR-MOS FET (hereinafter merely referred to as MOS) Q1 comprises source/drain regions 17 and 18 and a gate electrode 11, a DV-MOS Q3 comprises source/drain regions 19 and 20 and a gate electrode 12, and a FK-MOS Q6 comprises source/drain regions 21 and 22 and a gate electrode 13.

A FK-MOS Q5 comprises source/drain regions 23 and 24 and a gate electrode 14, a DV-MOS Q4 comprises source/drain regions 25 and 26 and a gate electrode 15, and a TR-MOS Q2 is formed of source/drain regions 27 and 28 and a gate electrode 16.

An interconnecting conductor 38 formed over the semiconductor substrate through an insulating layer is connected with the source/drain region 18 of the TR-MOS Q1 and the source/drain region 19 of the DV-MOS Q3 via a contact hole 29 and is connected with the gate electrode 13 of the FK-MOS Q6 via a contact hole 32 and is connected with the source/drain region 24 of the FK-MOS Q5 via a contact hole 34 and is connected with the gate electrode 15 of the DV-MOS Q4 via a contact hole 35.

Similarly, an interconnecting conductor 37 formed over the substrate with an insulating layer (e.g., a $SiO_2$ layer) 102 (see FIG. 6B) is connected with the gate electrode 12 of the DV-MOS Q3 via a contact hole 30 and is connected with the source/drain region 21 of the FK-MOS Q6 via a contact hole 31 and is connected with the gate electrode 14 of the FK-MOS Q5 via a contact hole 33 and is connected with the source/drain region 27 of the TR-MOS Q2 and the source/drain region 26 of the DV-MOS Q4 via a contact hole 36.

A lead electrode 39 for the source/drain region 20 of the DV-MOS Q3 and a lead electrode 40 for the source/drain region 25 of the DV-MOS Q4 also serve as ground lines and a lead electrode 47 for the source/drain regions 22 and 23 of the FK-MOS's Q6 and Q7 also serves as a power supply line.

The gate electrodes 11 and 12 of the TR-MOS's Q1 and Q2 form a part of a word line W (a first address signal conductor). The lead electrodes 41 and 42 for the source/drain regions 17 and 28 of the TR-MOS's Q1 and Q2 are connected with a data line (a second address signal conductor) not shown. Read and write of information from and to the cell is performed by selectively supplying signals to the first and second address signal conductors.

In FIG. 5, the interconnecting conductors 37 and 38 are separately shown and the contact holes 29 through 36 are omitted for clarity of FIG. 4. In FIG. 5, reference numerals for the lead electrodes which are omitted in FIG. 4 are added.

In FIG. 5, the lead electrode 43 is connected with the source/drain region 18 of the TR-MOS Q1 and the source/drain region 19 of the DV-MOS Q3. The lead electrode 44 is connected with the source/drain region 21 of the FK-MOS Q6 and the lead electrode 45 is connected with the source/drain region 24 of the FK-MOS Q5 and the lead electrode 46 is connected with the source/drain region 27 of the TR-MOS Q2 and the source/drain region 26 of the DV-MOS Q4.

In FIGS. 6A and 6B, a p-well 48, an n-well 49 and a p-well 50 are formed on the surface of a p-type substrate 100. Each of the above-mentioned MOS transistors Q1 through Q6 are formed in the surface of respective wells.

It is apparent from the above description that the MOS FETs Q5 and Q3 constitute a first inverter and the MOS FETs Q6 and Q4 constitute a second inverter. Both inverters are cross-connected with each other by the interconnecting conductors 37 and 38 to form a bistable circuit. A connection point between the MOS FETs Q5 and Q3 of the first inverter and a connection point between the MOS FETs Q6 and Q4 of the second inverter are provided with parasitic capacitances, respectively. Therefore, the first inverter and the parasitic capacitance and the second inverter and the parasitic capacitance form memory sections, respectively.

It is apparent from FIGS. 4, 5., 6A and 6B that the structure of the present embodiment has the following features.

(1) The gate electrodes 11 through 16 of all the MOS FETs Q1 through Q6 are formed in a substantially parallel relationship with each other.

(2) The interconnecting conductors 37 and 38 which connect the respective gate electrodes with the source/drain regions are formed substantially rectilinearly and are substantially parallel with each other.

(3) The planar structure of the source/drain regions, gate electrodes of the MOS FET transistors and interconnecting conductors are substantially point-symmetrically with respect to a central point C of the cell. As a result of this, the parasitic capacitances of memory nodes are substantially equal. Specifically, the capacitance formed by the diffusion layers 18 and 19 of the TR-MOS Q1 and DV-MOS Q3 is equal to that formed by diffusion layers 26 and 27 of the TR-MOS Q2 and DV-MOS Q4 and the capacitance formed by the diffusion layer 21 of the FK-MOS Q6 is equal to that formed by the diffusion layer 24 of the FK-MOS Q5.

Such a structure makes it possible to arrange the MOS FETs close to each other, resulting in an enhancement of an integration degree.

Since the planar structure of the cell is substantially point-symmetrical and the structure of portions where parasitic capacitances are formed are also symmetrical, the formed capacitance will be almost equal, resulting in that one memory state will not be readily changed to the other level between "H" and "L" levels.

Figure 7:
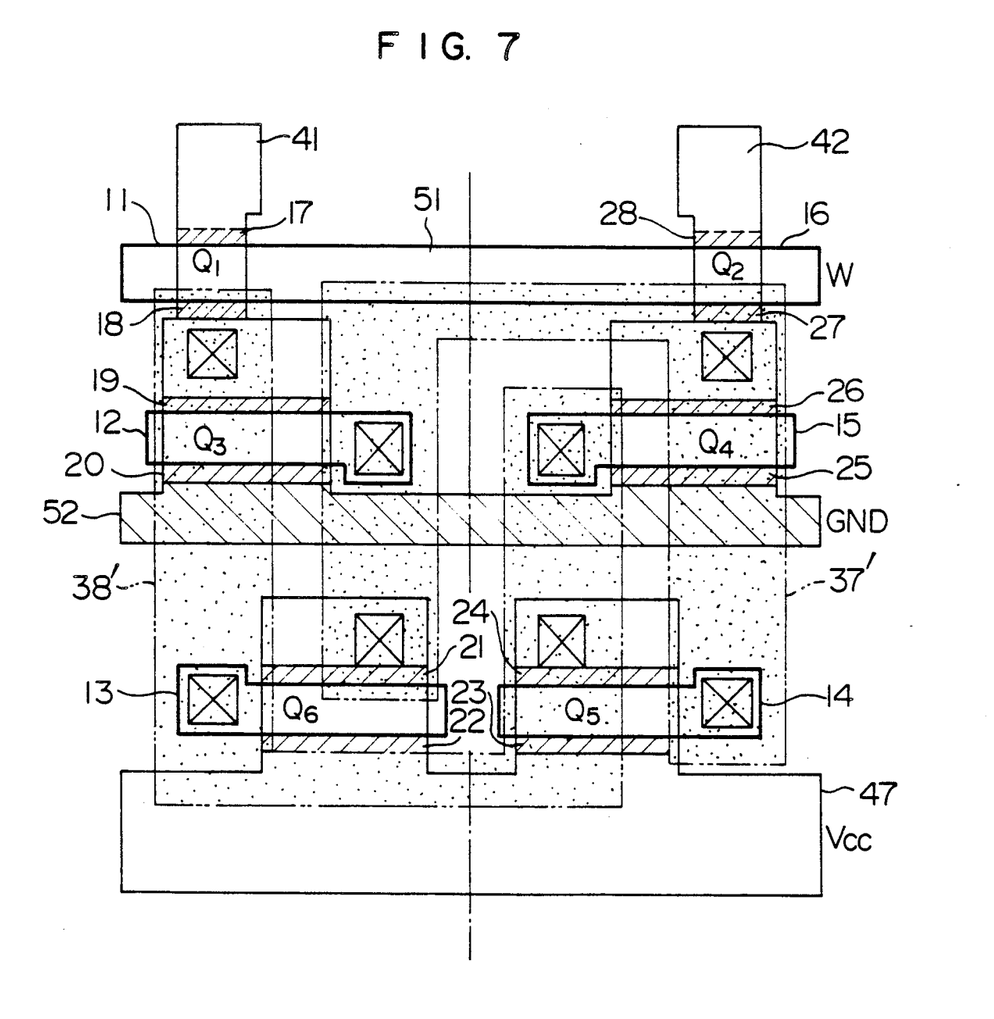
FIG. 7 is a plan view showing a CMOS SRAM device according to another embodiment of the present invention.

FIG. 7 is a plan view showing another embodiment of the present invention. Reference numerals used in FIGS. 4, 5, 6A and 6B represent like or equivalent components.

Comparison of the present embodiment with the embodiment shown in FIG. 4 shows that interconnecting conductors 38' and 37' are substantially point-symmetric and have portions which are substantially parallel with each other in the present embodiment. The interconnecting conductors 38' and 37' are substantially U-shaped and are interdigitated with each other. The TR-MOS Q1 and TR-MOS Q2 have common gate electrodes which form a word line 51. The lead electrode for the source/drain region 20 of the DV-MOS Q3 and the lead electrode for the source/drain regions 25 of the DV-MOS Q4 are common to form a ground line 25.

The structure of the present embodiment has the following features.

(1) The gate electrodes 11 through 16 of all the MOS FETs Q1 through Q6 are formed in a substantially parallel relationship.

(2) The planar structure of the source/drain regions and the gate electrodes of MOS transistors are substantially symmetrical with respect to a central line, resulting in equal capacitances of nodes (the capacitance formed by the diffusion layers 18 and 19 is substantially equal to that formed by the diffusion layers 26 and 27 and the capacitance formed by the diffusion layer 21 is substantially equal to that formed by the diffusion layer 24.

Therefore, the same effects as those of the former embodiment may be achieved with the present embodiment.

Although the above-mentioned two gate electrodes are shown as being arranged in a parallel relationship with each other, the present invention is not limited to this arrangement. Various changes and alteration may be possible within the spirit and scope of the present invention as far as a high integration is obtained by the symmetry of the built-up parasitic capacitances and use of self-alignment method.

Figure 8:
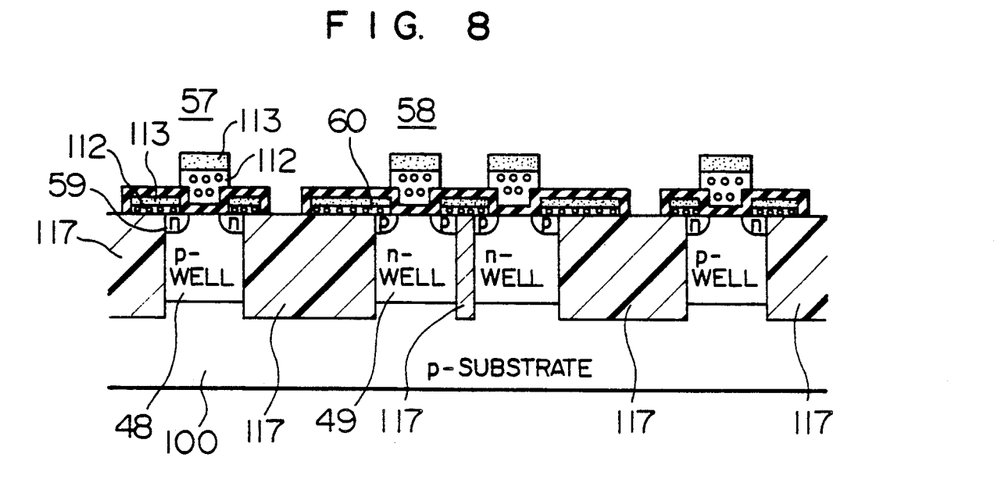
FIG. 8 is a sectional view showing another embodiment of the present invention.

FIG. 8 is a sectional view showing another embodiment in which trench isolation method is applied to a six MOS cell memory having the planar structure shown in FIG. 4. Reference numerals used in FIGS. 1 to 6 denote like or equivalent parts.

In FIG. 8, p-wells 48 and n-wells 49 are formed in the surface of a p-type substrate 100 so that they are separated with each other by insulators 117.

On the surface of the p- and n- wells 48 and 49 there are formed an n-MOS 57 and a p-MOS 58 comprising source/drain regions made of n+-diffusion layers 59 and p+-diffusion layers 60 and 2-layer structure conductors made of polysilicon 112 and tungsten polycide 113 serving as lead electrodes and gate electrodes, respectively.

In the present embodiment, isolation between n-MOS and p-MOS FETs can be positively achieved.

Figure 9:
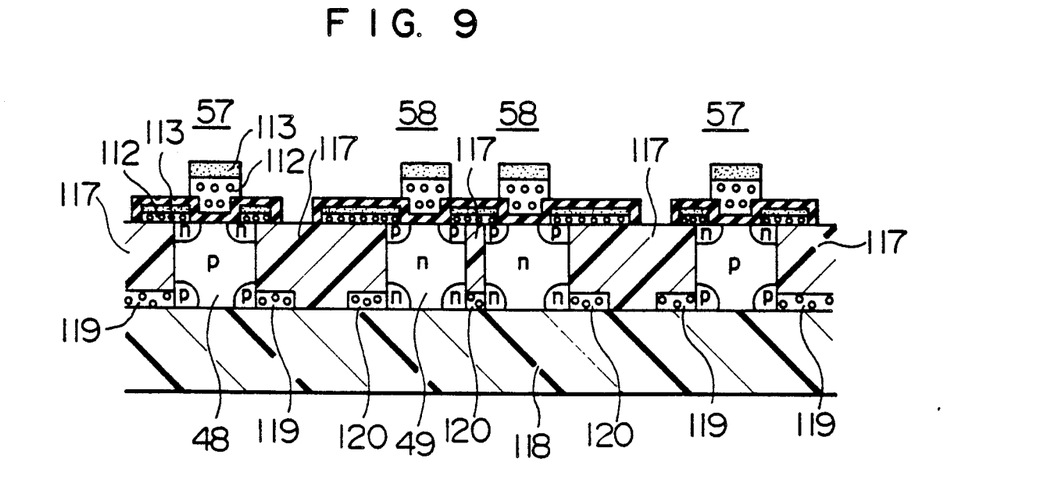
FIG. 9 is a sectional view showing another embodiment of the present invention.

FIG. 9 is a sectional view showing another embodiment in which SOI (silicon on insulator) technology is applied to a six MOS cell memory having the planar structure shown in FIG. 4. Reference numerals used in FIGS. 4 to 8 denote like or equivalent parts.

The present embodiment is featured in that MOS transistors are formed on an insulating substrate 118 and that power supply to p-wells 48 and n-wells 49 is accomplished via polysilicons 119 and 120 buried in insulators 117.

In accordance with the present embodiment, an adverse affect due to α-rays can be prevented and power supply to wells can be positively performed, resulting in an improvement in reliability.

We claim:

1. A semiconductor memory device including a plurality of semiconductor memory cells formed in a surface of a semiconductor substrate and arranged in rows and columns, each of said memory cells being connected with first and second address signal conductors for writing/reading information in the memory cell, said each memory cell comprising: first and second insulated gate field effect transistor (IG FET) inverters cross-coupled to each other through first and second interconnecting conductors to constitute a bistable circuit; a first IG FET transfer gate connected between said address signal conductors and said first inverter, said first IG FET transfer gate being connected with said first inverter through said second interconnecting conductor; and a second IG FET transfer gate connected between said address signal conductors and said second inverter, said second IG FET transfer gate being connected with said second inverter through said first interconnecting conductor, in which said first and second interconnecting conductors are arranged substantially point-symmetrically and have at least portions substantially parallel with each other on said surface of said substrate, and IG FETs constituting said first and second inverters have their gate electrodes arranged substantially parallel with one another and extending in a direction substantially perpendicular to said parallel portions of said first and second interconnecting conductors for said cross-coupling on said surface of said substrate, and IG FETs constituting said first and second transfer gates have their gate electrodes arranged substantially parallel with those of said IG FETs constituting said first and second inverters and forming part of one of said address signal conductors on said surface of said substrate.

2. A semiconductor memory device according to claim 1, in which said first and second interconnecting conductors generally extend substantially rectilinearly.

3. A semiconductor memory device according to claim 2, in which said IG FETs constituting said first and second inverters and said first and second transfer gates have their source/drain regions and gate electrodes arranged substantially point-symmetrically.

4. A semiconductor memory device according to claim 1, in which IG FETs constituting said first and second inverters and said first and second transfer gates have their source/drain regions and gate electrodes arranged substantially point-symmetrically.

5. A semiconductor memory device according to claim 1, in which said first and second interconnecting conductors are substantially U-shaped and interdigitated with each other.

6. A semiconductor memory device according to claim 5, in which said IG FETs constituting said first and second inverters and said first and second transfer gates have their source/drain regions and gate electrodes arranged substantially line-symmetrically.

7. A semiconductor memory device including a plurality of memory cells formed in a suface of a semiconductor substrate, each memory cel comprising a first inverter circuit including a series connection of a fist load IG FET (insulated gate FET) of a first conductivity type with a first driver IG FET of a second conductivity type, a second inverter circuit including a series connection of a second load IG FET of said first conductivity type with a second driver IG FET of said second conductivity type, and fist and second transfer IG FETs of said second conductivity type for controlling said fist and second inverter circuits, respectively, said first and second load IG FETs having their source/drain regions and gate electrodes arranged substantially symmetrically;

said fist driver FET having its source/drain regions and gate electrodes arranged substantially symmetric with those of said second driver FET, and said fist transfer IG FET having their source/drian regions a nd gate electrodes arranged substantial symmetrically with those of said second transfer FET, wherein the gate electrodes of said six IG FETs ae arranged substantially parallel with each other.

8. A semiconductor memory device according to claim 7, further including:
- a first interconnecting conductor formed over a suface of said semiconductor substrate for connecting a gate electrode of said first load IG FET of said first conductivity type, a gate electrode of the first driver IG FET of said second conductivity type, a source/drain region of the second load IG FET of said first conductivity type, a source/drain region of the second driver IG FET of said second conductivity type, and a source/drain region of the second transfer IG FET of said second conductivity type, with each other; and
- a second interconnecting conductor formed over the surface of said semiconductor substrate of connecting a gate electrode of said second load IG FET of said first conductivity type, a gate electrode of said second driver IG FET of said second conductivity type, a source/drain region of said first load IG FET of one conductivity type, a source/drain region of said first die IG FET f said second conductivity type, and a source/drain region of said first transfer IG FET of said first conductivity type, with each other.

9. A semiconductor memory device according to claim 8, win which said first and second interconnecting conductors are substantially rectilinear and are arranged in a substantially parallel relationship with each other.

10. A semiconductor memory device according to claim 7 in which said first and second load IG FETs have their source/drain regions and gate electrodes arranged in a substantially point-symmetrical relationship with respect to one point, said first driver IG FET has its source/drain regions and its gate electrode arranged substantially point-symmetrical with those of said second driver IG FET with respect to said point and arranged so as to be across said two load IG FETs from the latter, said first transfer IG FET has its source/drain regions and its gate electrode arranged substantially point-symmetrical with those of said second transfer IG FET with respect to said point and arranged so as to be across said two load IG FETs from the latter.

11. A semiconductor memory device according to claim 10, in which said first transfer IG FET has its source/drain regions and its gate electrode arranged substantially point-symmetrical with those of said second transfer IG FET with respect to said point and arranged so as to be across said two load IG FETs and said two driver IG FETs from the latter.

12. A semiconductor memory device according to claim 7, in which lead electrodes for source/drain regions of said IG FETs are formed by a self-alignment using field insulating layers as a mask.

13. A semiconductor memory device according to claim 7, in which each memory cell has first and second memory sections, and said fist memory section is comprised of said first load IG FET, said first driver IG FET and said second transfer IG FET, while said second memory section is comprised of said second load IG FET, said second driver IG FET and said first transfer IG FET.

* * * * *